US012669537B2

(12) United States Patent
Tseng et al.

(10) Patent No.: US 12,669,537 B2
(45) Date of Patent: Jun. 30, 2026

(54) INSPECTION SYSTEM WITH THERMAL INTERFACE, AND ELECTRONIC COMPONENT INSPECTION DEVICE AND METHOD

(71) Applicant: CHROMA ATE INC., Taoyuan City (TW)

(72) Inventors: I-Shih Tseng, Taoyuan City (TW); Chin-Yi Ou Yang, Taoyuan City (TW); I-Ching Tsai, Taoyuan City (TW); Xin-Yi Wu, Taoyuan City (TW)

(73) Assignee: CHROMA ATE INC., Taoyuan City (TW)

(*) Notice: Subject to any disclaimer, the term of this patent is extended or adjusted under 35 U.S.C. 154(b) by 157 days.

(21) Appl. No.: 18/662,134

(22) Filed: May 13, 2024

(65) Prior Publication Data

US 2025/0027987 A1 Jan. 23, 2025

(30) Foreign Application Priority Data

Jul. 21, 2023 (TW) ................................. 112127435

(51) Int. Cl.
| | |
|---|---|
| *G01R 31/00* | (2006.01) |
| *G01R 1/04* | (2006.01) |
| *G01R 31/28* | (2006.01) |

(52) U.S. Cl.
CPC ....... *G01R 31/2874* (2013.01); *G01R 1/0458* (2013.01)

(58) Field of Classification Search
CPC ............................ G01R 1/0458; G01R 31/2874
See application file for complete search history.

(56) References Cited

U.S. PATENT DOCUMENTS

| | | | | |
|---|---|---|---|---|
| 2011/0267082 A1* | 11/2011 | Fregeau | ................ | G01K 13/00 |
| | | | | 324/750.05 |
| 2013/0229198 A1 | 9/2013 | Fregeau et al. | | |
| 2015/0130493 A1* | 5/2015 | Kogure | ................ | G01R 1/0408 |
| | | | | 324/756.02 |

(Continued)

FOREIGN PATENT DOCUMENTS

| | | |
|---|---|---|
| CN | 113533932 A | 10/2021 |
| TW | 201001581 A | 1/2010 |

(Continued)

*Primary Examiner* — Thang X Le
(74) *Attorney, Agent, or Firm* — Birch, Stewart, Kolasch & Birch, LLP

(57) ABSTRACT

An inspection system with a thermal interface, and an electronic component inspection device and method are provided. First, a temperature regulator contacts an electronic component to be tested, where there is a thermal interface between the temperature regulator and the electronic component to be tested, and the electronic component to be tested includes a plurality of temperature sensing units. Then, the temperature regulator heats or cools the electronic component to be tested to a specific temperature, and the plurality of temperature sensing units of the electronic component to be tested detect temperatures at locations of the temperature sensing units. In this way, a contact condition between the temperature regulator and the electronic component to be tested, and quality or an aging status of the thermal interface can be determined.

7 Claims, 6 Drawing Sheets

(56)                    References Cited

U.S. PATENT DOCUMENTS

2017/0115339 A1 *    4/2017  Ho ..................... G01R 31/2874
2017/0176515 A1 *    6/2017  Lopez ................ G01R 31/2874
2018/0196084 A1 *    7/2018  Tustaniwskyj ..... G01R 31/2874
2021/0325453 A1 *    10/2021  Chan .................. G01R 31/2874

FOREIGN PATENT DOCUMENTS

TW          201319592  A1      5/2013
TW          202036010  A      10/2020

* cited by examiner

INSPECTION SYSTEM WITH THERMAL INTERFACE, AND ELECTRONIC COMPONENT INSPECTION DEVICE AND METHOD

CROSS-REFERENCE TO RELATED APPLICATION

This non-provisional application claims priority under 35 U.S.C. § 119 (a) to patent application No. 112127435 filed in Taiwan, R.O.C. on Jul. 21, 2023, the entire contents of which are hereby incorporated by reference.

BACKGROUND

Technical Field

The instant disclosure relates to an inspection system with a thermal interface, and an electronic component inspection device and method, and in particular, to a system, device, and method for inspecting quality of the thermal interface between an electronic component to be tested and an inspection device.

Related Art

An electronic component undergoes function or performance inspection before delivered from a factory, to ensure quality of a product. However, during the inspection process, the electronic component generates heat, most inspection devices generally are equipped with a temperature control means for the electronic components. For reference, a typical electronic component inspection device with temperature control means is shown in FIG. 1, where an electronic component under test C is shown in a central warped state to highlight the importance of the heat conduction interface.

As shown in FIG. 1, the electronic component to be tested C is accommodated in a IC socket S, and a pressing mechanism P above the IC socket S is used to press against the electronic component to be tested C, to ensure that the electronic component to be tested C can fully contact the probes inside the IC socket S. In addition, the pressing mechanism P also has the temperature control means that can cool the electronic component to be tested C. However, whether a lower surface of the pressing mechanism P is in complete contact with an upper surface of the electronic component to be tested C is extremely important for heat dissipation. There will often be high temperatures where the two do not touch, but as they are both hard flat surfaces, it is difficult to avoid gaps.

Therefore, a thermal interface material TIM is commonly arranged on the lower surface of the pressing mechanism P, to fill the gap in a contact interface between the lower surface of the pressing mechanism P and the upper surface of the electronic component to be tested C. However, since the thermal interface material TIM has a limited service life and it is difficult to detect when the thermal interface material TIM deteriorates, it is often not until a large number of the electronic component to be tested C fail due to high temperatures that the aging factor of the thermal interface material TIM is considered. Therefore, how to monitor an aging degree of the thermal interface material TIM becomes a major issue in the industry.

In addition to the thermal interface material TIM, the quality of the thermal interface between the pressing mechanism P and the electronic component to be tested C is also affected by flatness of contact surfaces between the pressing mechanism P, the electronic component to be tested C, and the IC socket S, and levelness of placement positions. However, in the related art, there is still no mechanism for inspecting a contact condition between the three in real time when an inspection machine runs online.

SUMMARY

In view of this, embodiments of the instant disclosure provide an inspection system with a thermal interface, and an electronic component inspection device and method, which directly use a hardware architecture of an existing electronic component inspection device, without the need to modify the machine or device, and can obtain quality and an aging status of the thermal interface in real time and monitor a contact condition of the thermal interface during or before inspection of an electronic component.

An inspection system with a thermal interface according to an embodiment of the instant disclosure can be configured to inspect at least one electronic component to be tested. The electronic component to be tested may include a plurality of temperature sensing units. The inspection system may include a test socket, a temperature regulator, and a controller. The test socket includes a chip slot that is configured to accommodate the electronic component to be tested. The chip slot may include an electrical contact interface that is configured to electrically contact the electronic component to be tested. The temperature regulator is suitable for regulating a temperature of the electronic component to be tested, and the thermal interface is between the temperature regulator and the electronic component to be tested. The controller is electrically connected to the test socket and the temperature regulator. The controller controls the temperature regulator to heat or cool the electronic component to be tested to a specific temperature, and temperatures at locations of the plurality of temperature sensing units are detected through the plurality of temperature sensing units.

An electronic component inspection method according to an embodiment of the instant disclosure includes the following steps: first, a temperature regulator contacts an electronic component to be tested, where there is a thermal interface between the temperature regulator and the electronic component to be tested, and the electronic component to be tested includes a plurality of temperature sensing units. Then, the temperature regulator heats or cools the electronic component to be tested at a specific temperature. Further, the plurality of temperature sensing units of the electronic component to be tested detect temperatures at locations of the plurality of temperature sensing units.

An electronic component inspection device according to an embodiment of the instant disclosure includes a test socket, a workpress, and a controller. The test socket includes a chip slot that is configured to accommodate an electronic component to be tested. The chip slot includes an electrical contact interface that is configured to electrically contact the electronic component to be tested. The electronic component to be tested includes a plurality of temperature sensing units. The workpress includes a temperature regulator, and the workpress can be selectively moved towards or away from the test socket. The controller is electrically connected to the test socket and the workpress. When the electronic component to be tested is accommodated in the chip slot of the test socket, the controller controls the workpress to move towards the test socket and contact the electronic component to be tested, where there is a thermal interface between the workpress and the electronic component to be tested; and the controller controls the temperature regulator to heat or cool the electronic component to be tested to a specific temperature, and temperatures at locations of the plurality of temperature sensing units are detected through the plurality of temperature sensing units.

Based on the above, according to the inspection system with a thermal interface, and the electronic component inspection device and method in some embodiments, the temperature regulator can be used to heat or cool the electronic component to be tested, and the temperature sensing units of the electronic component to be tested can be used to detect the temperature. In this way, a contact condition between the temperature regulator and the electronic component to be tested, as well as the quality or the aging status of the thermal interface can be determined based on a heating or cooling condition of the electronic component to be tested.

DETAILED DESCRIPTION

Figure 2:
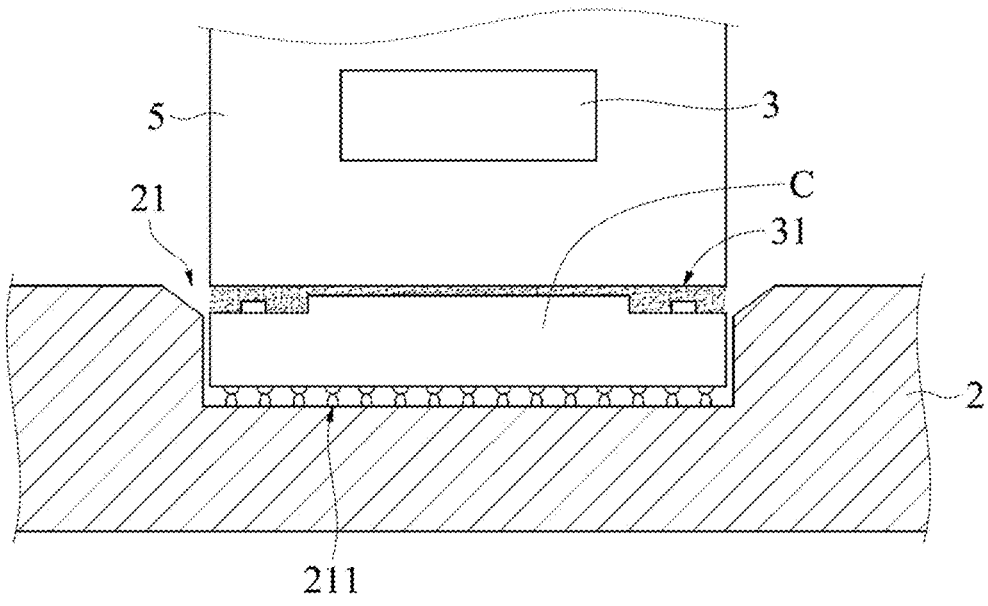
FIG. 2 is a schematic cross-sectional view of an embodiment of an electronic component inspection device according to the instant disclosure.
Figure 3:
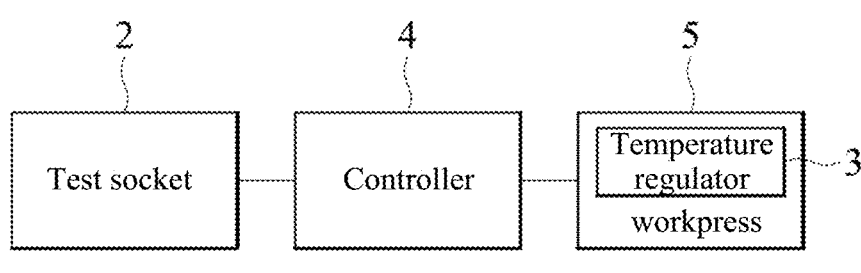
FIG. 3 is a system architecture diagram of an embodiment of an electronic component inspection device according to the instant disclosure.
Figure 4:
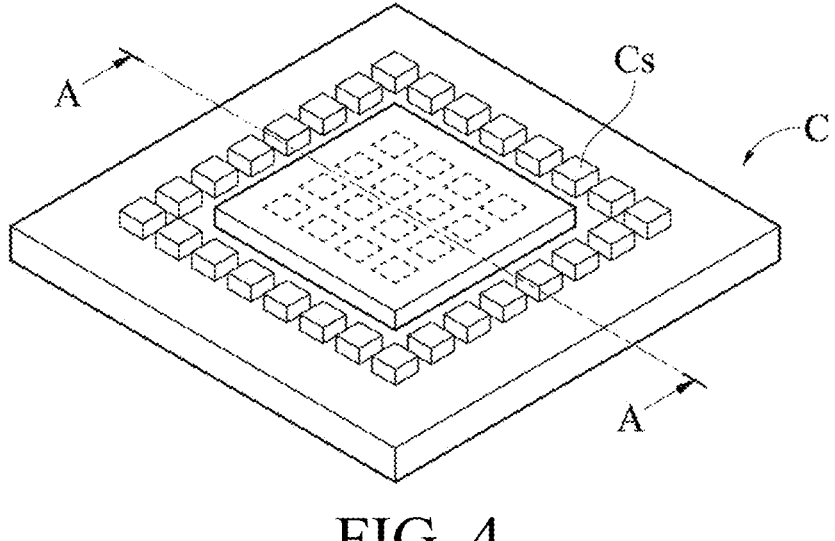
FIG. 4 is a three-dimensional diagram of an embodiment of an electronic component to be tested according to the instant disclosure.

Refer to FIG. 2, FIG. 3, and FIG. 4. FIG. 2 is a schematic cross-sectional view of an embodiment of an electronic component inspection device according to the instant disclosure. FIG. 3 is a system architecture diagram of an embodiment of an electronic component inspection device according to the instant disclosure. FIG. 4 is a three-dimensional diagram of an embodiment of an electronic component to be tested according to the instant disclosure. As shown in the figure, in an embodiment, an electronic component inspection device mainly includes a test socket 2, a workpress 5, and a controller 4. The test socket 2 includes a chip slot 21 that is configured to accommodate an electronic component to be tested C. An electrical contact interface 211, for example, the probes, are provided on a bottom surface of the chip slot 21, and may be configured to electrically contact contacts or solder balls on the bottom surface of the electronic component to be tested C.

Figure 5:
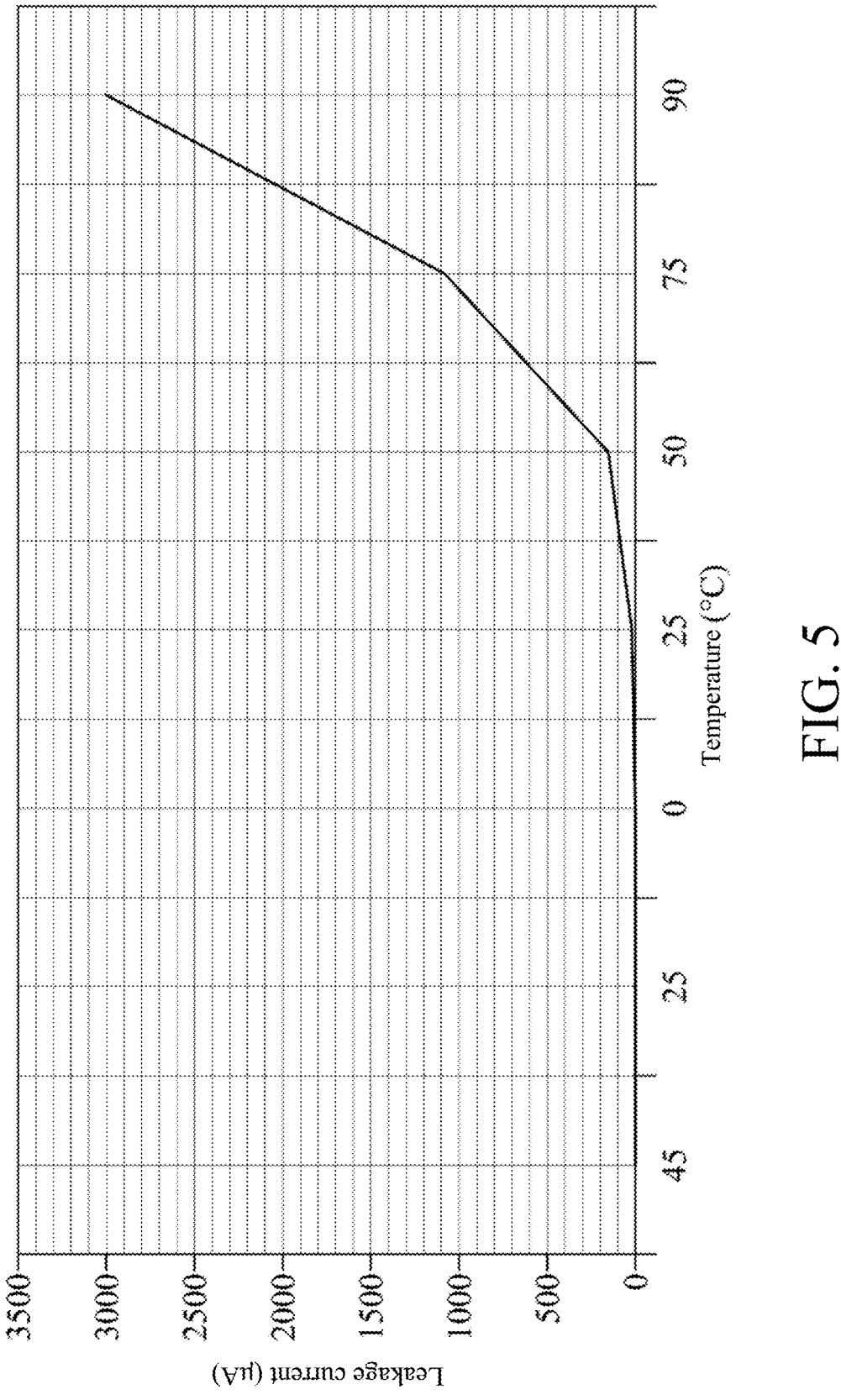
FIG. 5 is a diagram of a relationship between a temperature and a leakage current of an electronic component to be tested according to an embodiment of the instant disclosure.

Furthermore, as shown in FIG. 4, the electronic component to be tested C includes a plurality of temperature sensing units Cs, which can be diodes distributed on a surface or inside the electronic component to be tested C. A quantity of the temperature sensing units Cs can be as high as dozens or even hundreds. In an embodiment, the temperature sensing units Cs can obtain a temperature mainly by measuring a leakage current. Further, referring to FIG. 5, FIG. 5 is a diagram of a relationship between a temperature and a leakage current of an electronic component to be tested C according to an embodiment of the instant disclosure. As can be seen from FIG. 5 that a higher temperature indicates a larger leakage current of the diodes. Especially above 50° C., the leakage current increases significantly, and above 75° C., the leakage current increases even faster.

However, in an embodiment of the instant disclosure, this phenomenon is utilized as a temperature measurement means. In other words, the temperature sensing units Cs can detect the leakage current of the diodes, and substitute the leakage current into a relevant calculation module, an equation, or the diagram of the relationship between the temperature and the leakage current shown in FIG. 5, to perform conversion to calculate a temperature at a location of each of the temperature sensing units Cs.

Refer to FIG. 2 and FIG. 3 again. In an embodiment of the instant disclosure, the workpress 5 is usually arranged directly above the test socket 2 and can be moved up and down, so that the workpress can be controlled to selectively move towards or away from the test socket 2. A lower surface of the workpress 5 is provided with a thermal interface 31, which can be a thermal interface material (TIM), such as a viscous or gel-type material containing lead-tin series solder (PbSn), lead-free solder, silver paste (Ag), gold, tin, gallium, indium, carbon composite, graphite, carbon nanotubes, or other suitable thermally conductive materials, and may be formed on the lower surface of workpress 5 by deposition, lamination, printing, plating, or any other suitable technique.

In addition, a temperature regulator 3 may be arranged inside the workpress 5, and may be a high temperature generator or a low temperature generator. For example, the temperature regulator 3 may include but is not limited to a resistive heating source, a thermoelectric cooling module (TEC), or other devices using temperature control fluids. In an embodiment, the workpress 5 is mainly configured to apply a force to press down the electronic component to be tested C to ensure that contacts on a lower surface of the electronic component to be tested C can be completely in electrical contact with the electrical contact interface 211 on the bottom surface of the chip slot 21, which is the probes. However, the temperature regulator 3 further provides the workpress 5 with a function of temperature control for the electronic component to be tested C, such as performing a high temperature test, performing a low temperature test, or performing heat dissipation for the electronic component to be tested C.

Furthermore, the controller 4 is electrically connected to the test socket 2 and the workpress 5. The controller 4 may be a dedicated electronic device, a desktop computer, a laptop computer, a tablet computer, an industrial computer, a server, or other computing devices having a data processing capabilities.

Figure 6:
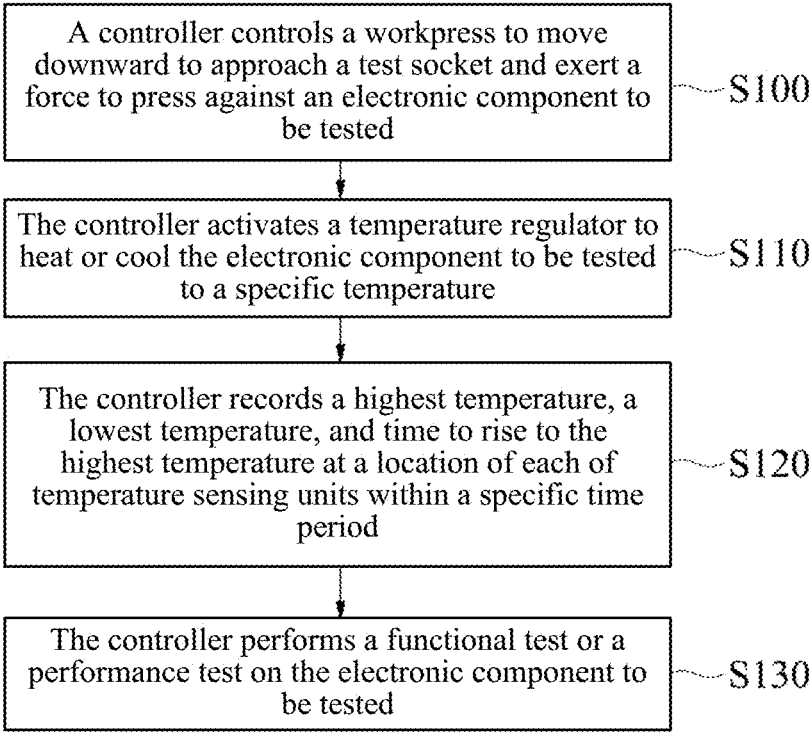
FIG. 6 is a flowchart of an embodiment of an electronic component inspection method according to the instant disclosure.

The following describes an electronic component inspection method according to an embodiment of the instant disclosure. Refer to FIG. 2, FIG. 3, and FIG. 6. FIG. 6 is a flowchart of an embodiment of an electronic component inspection method according to the instant disclosure. After the electronic component to be tested C is placed into the chip slot 21 of the test socket 2, the controller 4 controls the workpress 5 to move downward to approach the test socket 2 and exert a force to press against the electronic component to be tested C, that is, step S100. The controller 4 activates the temperature regulator 3 to heat or cool the electronic component to be tested C to a specific temperature, that is, step S110. In an embodiment, the controller 4 controls the temperature regulator 3 to temporarily heat the electronic component to be tested C. For instance, the temperature regulator 3 can raise the temperature from room temperature to 70° C. within a specific timeframe (a few seconds) and then immediately cease heating. To enhance testing efficiency, in other embodiments, the temperature regulator 3 can also apply immediate cooling.

Figure 7:
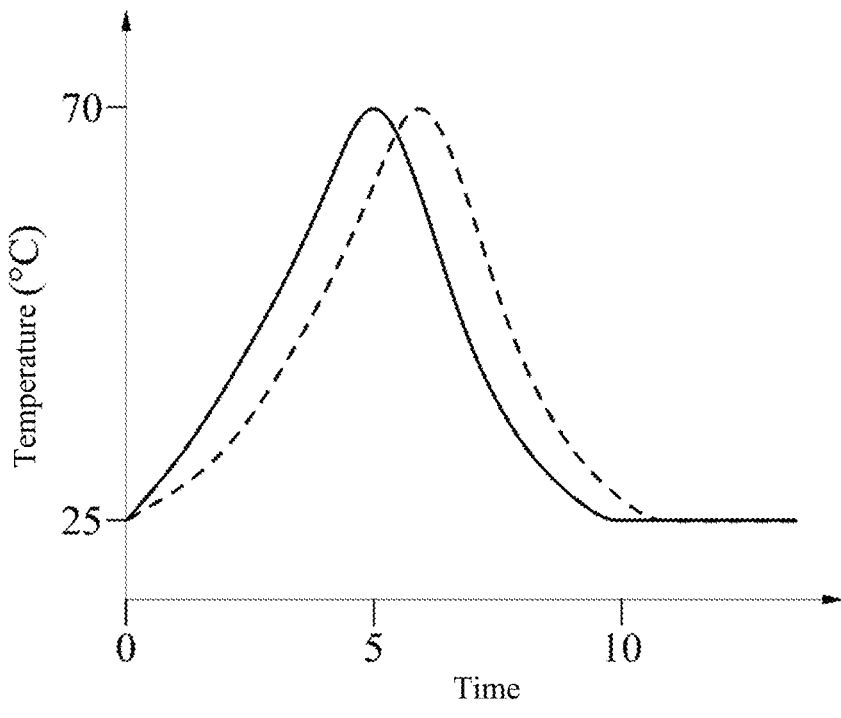
FIG. 7 is a diagram of a relationship between time and a temperature of a temperature regulator and a temperature sensing unit.

Refer to FIG. 7. FIG. 7 is a diagram of a relationship between time and the temperatures of a temperature sensing unit Cs. While the temperature regulator 3 is heated, the controller 4 records a highest temperature, a lowest temperature, and time to reach the highest temperature at one location of the temperature sensing unit Cs within a specific time period, as step S120. Based on these measured values, the quality or aging condition of the thermal interface 31 can be determined.

Further, the solid line in FIG. 7 represents the heating and cooling curve of the temperature regulator 3, while the dashed line represents the heating and cooling curve detected by the temperature sensing units Cs. As can be clearly seen from the figure, since the highest temperatures and the lowest temperatures of the dashed line and the solid line are consistent, and regardless of whether the temperature rises or drops, a temperature delay detected by the temperature sensing units Cs is extremely short when the temperature sensing units Cs and the temperature regulator 3 are at the same temperature. Therefore, it can be judged that that the thermal interface 31 still maintains a good thermally conductive property. Finally, a formal test phase of the electronic component to be tested C can be entered, step S130; that is, the controller 4 performs a functional test, a performance test, a burn-in test, or other semiconductor tests on the electronic component to be tested C.

Figure 1:
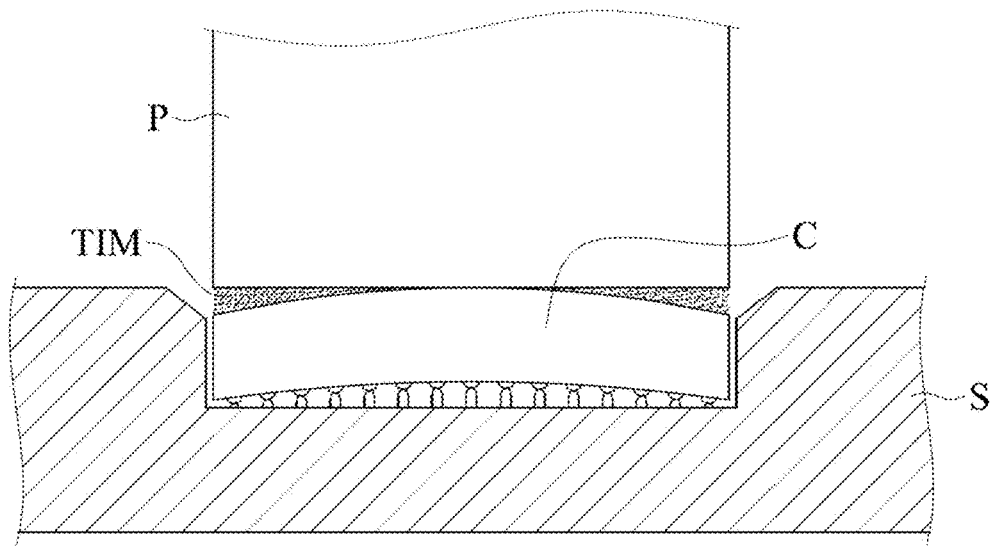
FIG. 1 is a schematic cross-sectional view of a conventional electronic component inspection device having a temperature control means.
Figure 8A:
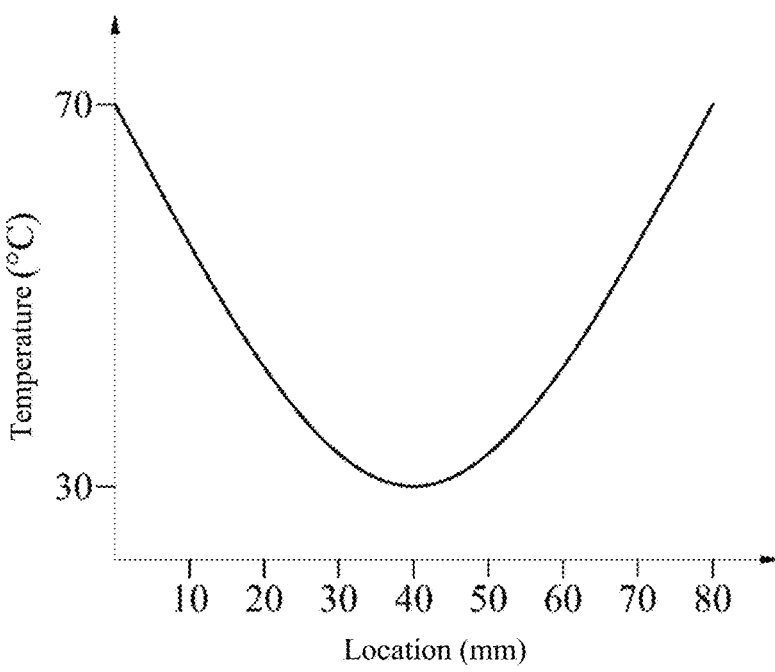
FIG. 8A is a diagram of a relationship between the locations and the temperatures of the temperature sensing units in a centrally warped electronic component to be tested.

Refer to FIG. 8A. FIG. 8A is a diagram of a relationship between the locations and the temperatures of the temperature sensing units Cs in a centrally warped electronic component to be tested C. In an embodiment, in addition to inspecting the quality or the aging status of the thermal interface 31, a contact condition between the workpress 5 and the electronic component to be tested C may also be obtained based on other parameters. In FIG. 8A, the horizontal coordinate represents the locations of each of the temperature sensing units Cs in a cross section of the electronic component to be tested C, which can refer to the AA line segment in FIG. 4, and the vertical coordinate represents the temperatures at that locations. Therefore, as can be seen from FIG. 8A that the temperature in the center position of the electronic component to be tested C is the lowest, which indicates that the contact condition is the best at this location. While the temperatures at two ends are the highest, which indicates that the contact condition is poor at these locations. Based on this, it can be judged from FIG. 8A that the central part of the electronic component to be tested C is warped. For a specific contact condition, refer to FIG. 1.

Figure 8B:
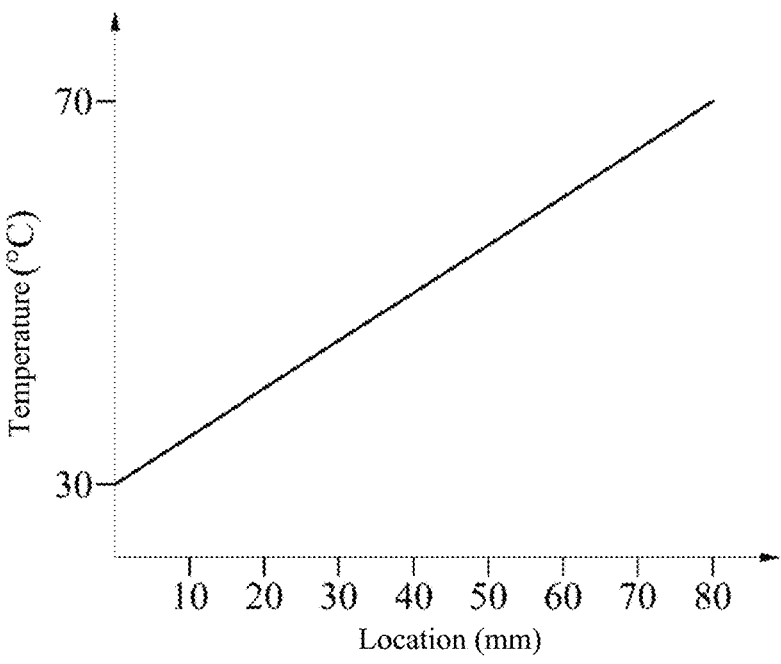
FIG. 8B is a diagram of a relationship between the locations and the temperatures of the temperature sensing units of an electronic component to be tested when a test socket is tilted.

Refer to FIG. 8B. FIG. 8B is a diagram of a relationship between the locations and the temperatures of the temperature sensing units Cs of an electronic component to be tested C when a test socket 2 is tilted. As can be seen from FIG. 8B, the temperature at a left end of the electronic component to be tested C is the lowest, and gradually increases towards the right end, which means that the contact condition between the workpress 5 and the left end of the electronic component to be tested C is the best, while the contact condition at the right end is the worst. However, once this case occurs, it means that a left side of the test socket 2 is tilted upwards, or the lower surface of the workpress 5 is uneven, and it shrinks inward upwards from the left to the right.

Overall, the instant disclosure can inspect a property of the thermal interface 31 without changing an original hardware configuration of an inspection device. In other words, by using the measurement mechanism built into the electronic component under test C to measure the leakage currents of the internal diodes, the temperature can be obtained, and thus the quality or aging condition of the thermal interface 31 can be judged. Therefore, the machine does not need to be shut down for inspection. The thermal interface 31 can be directly inspected before the electronic component to be tested C is tested. Inspected time is very short and will not waste too much time for waiting. In this way, testing efficiency and a testing yield can be significantly improved. In addition, the method of the instant disclosure can also be used to determine whether the electronic component to be tested C is deformed, or whether there is an error in the installation or use of the device after a period of time.

Although the instant disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An inspection system with a thermal interface, configured to inspect at least one electronic component to be tested, wherein the at least one electronic component to be tested comprises a plurality of temperature sensing units, and the inspection system comprises:

a test socket comprising a chip slot, wherein the chip slot is configured to accommodate the at least one electronic component to be tested; and the chip slot comprises an electrical contact interface that is configured to electrically contact the at least one electronic component to be tested;

a temperature regulator is suitable for regulating a temperature of the at least one electronic component to be tested, and the thermal interface is between the temperature regulator and the at least one electronic component to be tested; and a controller electrically connected to the test socket and the temperature regulator, wherein the controller controls the temperature regulator to heat or cool the at least one electronic component to be tested to a specific temperature, and temperatures at locations of the plurality of temperature sensing units are detected through the plurality of temperature sensing units, wherein the plurality of temperature sensing units are configured to detect leakage currents of a plurality of diodes, and calculate temperatures at locations of the plurality of temperature sensing units based on the leakage currents.

7

2. The inspection system according to claim 1, wherein the controller controls the temperature regulator to temporarily heat the at least one electronic component to be tested, and records a highest temperature, a lowest temperature, and time to reach the highest temperature at the locations of the plurality of temperature sensing units within a specific time period.

3. An electronic component inspection method, comprising the following steps:

(A) contacting, by a temperature regulator, at least one electronic component to be tested, wherein there is a thermal interface between the temperature regulator and the at least one electronic component to be tested, and the at least one electronic component to be tested comprises a plurality of temperature sensing units;

(B) heating or cooling, by the temperature regulator, the electronic component to be tested at a specific temperature; and (C) detecting, by the plurality of temperature sensing units of the at least one electronic component to be tested, temperatures at locations of the temperature sensing units, wherein the plurality of temperature sensing units are configured to detect leakage currents of a plurality of diodes, and calculate the temperatures at the locations of the plurality of temperature sensing units based on the leakage currents.

4. The electronic component inspection method according to claim 3, wherein in step (A), the controller controls the temperature regulator to contact the at least one electronic component to be tested; in step (B), the controller controls the temperature regulator to temporarily heat the at least one electronic component to be tested; and in step (C), the controller records a highest temperature, a lowest temperature, and time to reach the highest temperature at the locations of the plurality of temperature sensing units within a specific time period.

5. The electronic component inspection method according to claim 4, wherein after step (C), the method further comprises step (D) in which the controller performs at least one of a functional test and a performance test on the at least one electronic component to be tested.

6. An electronic component inspection device, comprising:

a test socket comprising a chip slot, wherein the chip slot is configured to accommodate at least one electronic component to be tested; the chip slot comprises an electrical contact interface that is configured to electrically contact the at least one electronic component to be tested; and the at least one electronic component to be tested comprises a plurality of temperature sensing units;

a workpress comprising a temperature regulator, wherein the workpress selectively movable towards or away from the test socket; and a controller electrically connected to the test socket and the workpress, wherein, in response to the at least one electronic component to be tested being accommodated in the chip slot of the test socket, the controller controls the workpress to move towards the test socket and contact the at least one electronic component to be tested, and there is a thermal interface between the workpress and the at least one electronic component to be tested; the controller controls the temperature regulator to heat or cool the electronic component to be tested to a specific temperature, and temperatures at locations of the plurality of temperature sensing units are detected through the plurality of temperature sensing units, wherein the plurality of temperature sensing units are configured to detect leakage currents of a plurality of diodes, and calculate the temperatures at the locations of the plurality of temperature sensing units based on the leakage currents.

7. The electronic component inspection device according to claim 6, wherein the controller controls the temperature regulator to temporarily heat the at least one electronic component to be tested, and records a highest temperature, a lowest temperature, and time to reach the highest temperature at the locations of the plurality of temperature sensing units within a specific time period.

* * * * *